US005214343A

United States Patent [19]

Baumoel

[11] Patent Number: 5,214,343

[45] Date of Patent: May 25, 1993

[54] FLUOROETHER GREASE ACOUSTIC COUPLANT

[76] Inventor: Joseph Baumoel, 107 Columbia Dr., Jericho, N.Y. 11753

[21] Appl. No.: 667,466

[22] Filed: Mar. 11, 1991

[51] Int. Cl.$^5$ .................................... H01L 41/08

[52] U.S. Cl. .................................... 310/334; 310/327; 310/337; 73/702; 73/703

[58] Field of Search .................... 310/334, 337, 327; 73/702, 703

[56] References Cited

U.S. PATENT DOCUMENTS

| | | | |
|---|---|---|---|
| 3,942,381 | 3/1976 | Brown et al. | 73/703 |
| 3,987,674 | 10/1976 | Baumoel | 73/194 A |
| 4,144,517 | 3/1979 | Baumoel | 340/1 L |
| 4,326,274 | 4/1982 | Hotta et al. | 367/118 |
| 4,373,401 | 2/1983 | Baumoel | 310/327 |
| 4,523,122 | 6/1985 | Tone et al. | 310/334 |
| 4,647,413 | 3/1987 | Savu | 260/544 F |
| 4,929,368 | 5/1990 | Baumoel | 252/11 |
| 4,962,330 | 10/1990 | Lierke et al. | 310/334 |
| 5,040,415 | 8/1991 | Barkhoudarian | 73/703 |

*Primary Examiner*—Mark O. Budd
*Assistant Examiner*—Thomas M. Dougherty
*Attorney, Agent, or Firm*—Ostrolenk, Faber, Gerb & Soffen

[57] ABSTRACT

A couplant material for establishing a sonic path of good acoustical impedance between an ultrasonic transducer housing and its crystal, and the housing and a pipe to which the housing is attached. The material is capable of being easily applied at room temperature and withstanding vibration and thermal cycling from cryogenic temperatures to over 500° F. while substantially maintaining its chemical, physical and acoustical properties. A preferred couplant material is a polytetrafluoroethylene grease or perfluoropolyalkylether grease, which have been used previously as lubricants.

11 Claims, 1 Drawing Sheet

FLUOROETHER GREASE ACOUSTIC COUPLANT

RELATED CASES

This application is related to U.S. Pat. No. 4,929,368 entitled "FLUOROETHER GREASE ACOUSTIC COUPLANT" in the name of Joseph Baumoel.

BACKGROUND OF THE INVENTION

The present invention relates to a clamp or ultrasonic transducer and to a novel ultrasonic coupling compound which is physically and chemically stable over a large temperature range for coupling the transducer crystal to the transducer housing, and for coupling the housing to a conduit.

A coupling medium, such as a grease or the like, is commonly used to insure that ultrasonic energy can be transmitted between a crystal and a transducer housing and the structure to which the housing is connected. The coupling medium should not degrade rapidly in its sonic conduction ability and should remain in place and stable in the space between the surface being coupled over a wide temperature range, for example, from very low, cyrogenic temperatures to about 500° F., or to the temperature limit of the transducers. Ultrasonic transducers are frequently clamped to surfaces in an environment in which the coupling material will be subject to high temperature, vibration and other harsh environmental conditions. For example, "clamp-on" ultrasonic flowmeters which monitor fluid flow as disclosed in either of Baumoel U.S. Pat. No.s 3,987,674 or 4,373,401 or fluid level as shown in Baumoel U.S. Pat. No. 4,144,517 may be subjected to temperatures from cryogenic to 500° F. or higher due to extremely hot fluids within the conduit. Presently available ultrasonic coupling greases are unsuitable for such conditions and have a relatively short life. For example, the commonly available colloidal grease type couplants will exhibit an excessive degree of thermal outgassing with eventual loss of physical properties and loss of sonic coupling. Such changes cause loss of ultrasonic coupling which could result in a failure of the equipment. Due to outgassing, chemical deterioration, or changed molecular crosslinking, the in-service life of common couplants is very unsatisfactory at high temperatures. Because of this relatively short predicted service life, frequent changing of the couplant is necessary. Even where the couplant is used at lower temperature and exhibits slower physical and chemical change, it must be changed occasionally, resulting in down time and maintenance expenses.

A typical prior art couplant material is DOW-CORNING 340 Heat Sink Compound. This material is believed to be described in U.S. Pat. No. 4,738,737 and is a grease-like silicone fluid heavily filled with zinc oxide, used as an acoustic couplant material under high-temperature and high-radiation conditions. However, it has been found that such a material does not maintain its sonic properties for a long enough time to avoid numerous changes of couplant.

Accordingly, there has been a long-standing need for a couplant which:

1. provides required acoustical properties in the form of a sound path with good acoustical impedance between a crystal, its housing and the pipe or other sonic medium to which the housing is attached;

2. withstands thermal cycling from room temperatures, and in some cases, to temperatures over 500° F.;

3. maintains stable acoustical properties for periods of time which may be as great as several years between planned maintenance intervals;

4. emits a minimum of irritating fumes and does not outgas and disturb the sonic path;

5. has a viscosity which provides for ease of application and use; and 6. does not require expensive surface preparation of the conduit or pipe surfaces in the field, such as grinding or machining.

In search of a couplant which would answer all of these long-standing needs, various materials which were available commercially for other uses were studied. The intent was to identify a material that did not have objectionably high contents of sulfur or lead or other toxic or noxious material; had the ability to perform the ultrasonic couplant function at temperatures commonly encountered in flow meter applications; had a viscosity which was suitable for easy use as an ultrasonic couplant; and did not have hazardous or irritating fumes.

Fluoroether greases were identified as satisfactory couplant materials, particularly two specific fluoroether greases; Nye Fluoroether Grease 849 and Dupont Krytox® grease. These greases are known fluoroether lubricants; however, nothing suggests that fluorinated ethers, and particularly the Nye Fluoroether Grease 849 and Dupont Krytox® grease lubricants would be stable acoustical coupling greases operable over a wide temperature range for a long time without physical or chemical changes.

SUMMARY OF THE INVENTION

In accordance with the invention, a fluoroether grease is used as a low sonic impedence coupling compound. The invention uses the couplant material for establishing a sound path of good acoustical impedance between a transducer crystal, its housing and a sound conducting medium to which the housing is attached. The fluoroether couplant material of the invention is capable of withstanding thermal cycling from cryogenic temperature to temperatures over 500° F. Such fluoroether grease provides a good sonic impedance interface between an ultrasonic transducer crystal and its housing and between the housing and a metal substrate. The grease material is applied between the substrate and the ultrasonic transducer housing and between housing and crystal. The housing is thereafter mechanically secured to the ultrasonic transducer housing. The substrate might be, for example, a fluid-carrying pipe.

DESCRIPTION OF THE PREFERRED EMBODIMENT

Figure 1:
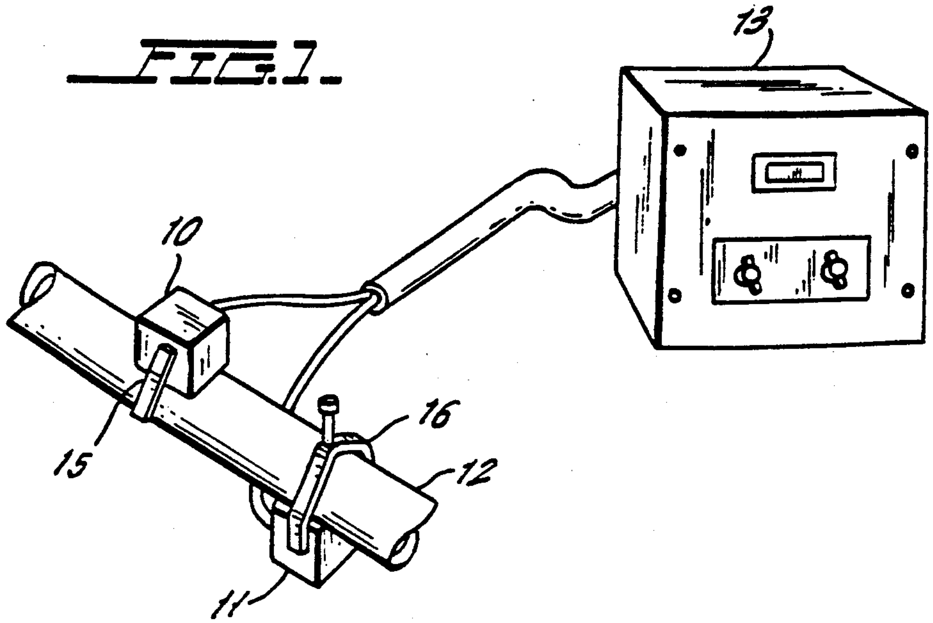
FIG. 1 is a schematic drawing of an ultrasonic flowmeter clamped to a fluid pipe or conduit and employs the couplant of the invention and further shows controls for producing and processing ultrasonic signals.

Referring first to FIG. 1, there is schematically illustrated two transducer housings 10 and 11 which are clamped onto a hollow conduit or pipe 12. Conduit 12 may be of any desired material such as steel, plastic, concrete, or the like, of any known wall thickness and which contains or conducts any desired fluid, such as water, oil, liquid metals, sewerage or the like. Conduit 12 may have a diameter, typically, from ½ inch to 60 inches.

Transducer housings 10 and 11 are clamped on opposite sides of the exterior diameter of pipe 12 by the clamping straps 15 and 16. The transducers could be disposed on the same surface and operate in a reflective mode if desired. The housings 10 and 11 are longitudinally spaced from one another and may operate as disclosed in U.S. Pat. No. 3,987,674, herein incorporated by reference.

An exemplary ultrasonic flowmeter schematically illustrated in FIG. 1 may be of the type sold commercially by Controlotron Corporation, 155 Plant Avenue, Hauppauge, New York 11788, the assignee of the present invention, under the designation "System 960" or "System 990." Other ultrasonic equipment may be used.

In order to establish an interface of good acoustical impedance between the housings 10 and 11 and the supporting substrate 12 to which they are connected, a coating of couplant material 20 (see FIG. 2) of the invention is applied between the substrate 12 and the ultrasonic transducers 10 and 11. The housings are then mechanically secured to the substrate 12 by means of straps 15 and 16 which clamp them to the pipe 12. Any suitable mechanical clamping means may be used.

Figure 2:
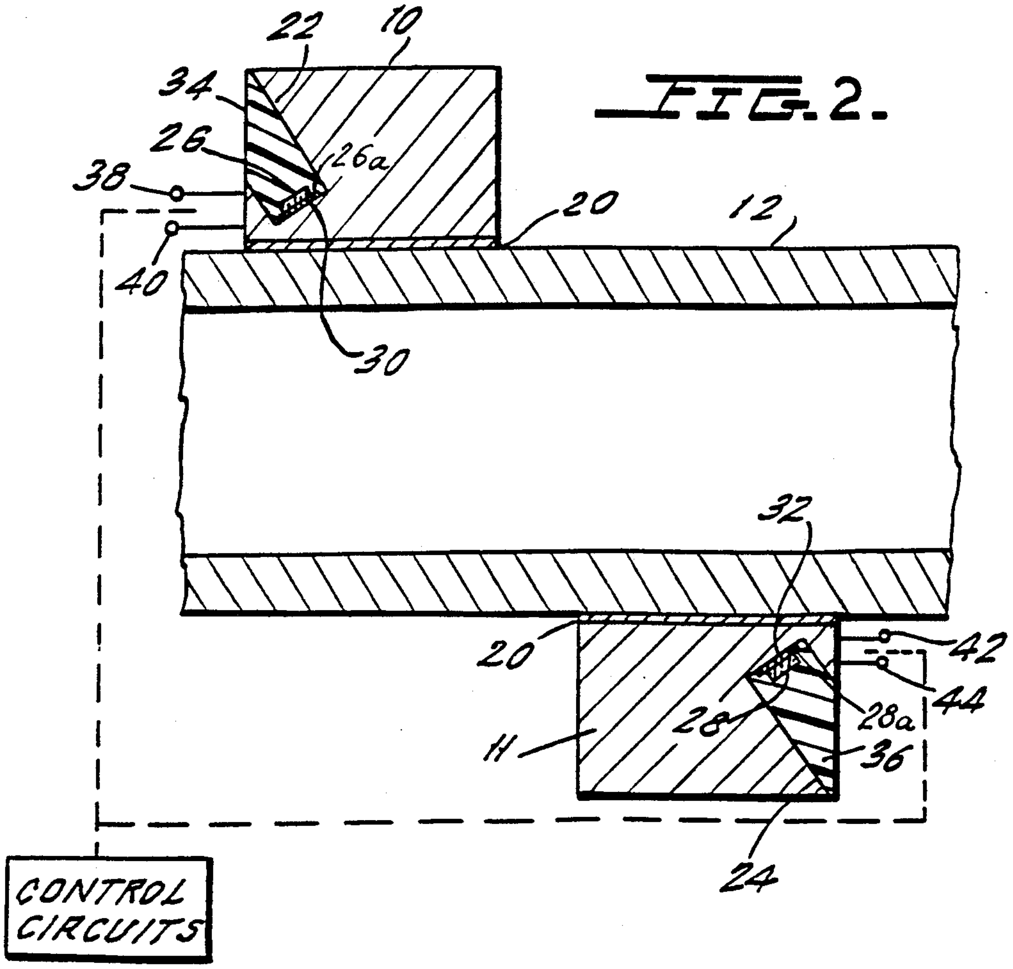
FIG. 2 is a cross-sectional view of the transducers and conduit illustrated in FIG. 1 showing the couplant of the invention between the crystals and their housing and between the housing and a conduit.

FIG. 2 is a cross-sectional view through the transducers 10 and 11 and the pipe 12 to which they are coupled and generally shows a typical construction for the housings 10 and 11, and also shows the couplant 20. Housings 10 and 11 are generally identical to one another and consist of prisms of any desired material, which has the desired sound transmission qualities. The longitudinal velocity of sound in the housings 10 and 11 is lower than the shear mode velocity of sound in the wall of pipe 12, if metallic. Channels 22 and 24 are formed in housings 10 and 11, and receive active transducer "crystals" 26 and 28, respectively. Active transducer crystals 26 and 28 may be of any desired type, such as barium titanate ceramic elements, or the like, and are generally thin flat members having active flat faces which face the outer surface of conduit or pipe 12, and are arranged to produce ultrasonic energy in pulse form in a direction perpendicular to the bases 30 and 32 of slots 22 and 24, respectively. Very thin couplant layers **26*a* and 28*a*, shown in FIG. 2, couple the ultrasonic energy from the faces of crystals 26 and 28 to the flat bases 30 and 32 of slots 22 and 24, respectively Couplant layers 26*a* and 28*a* may be of the same material as couplant 20. The channels 22 and 24 are then encapsulated with any suitable plastic encapsulating material shown as encapsulating masses 34 and 36, respectively which holds crystals 26 and 28** in place.

Crystal elements 26 and 28 are provided with terminals 38, 40 and 42, 44, respectively, which are electrically connected to electronic control system 13, which will produce and receive and process ultrasonic signals associated with crystals 26 and 28, respectively.

When any transducer equipment is coupled to any container, whether it be an ultrasonic flowmeter, such as the "System 990" flowmeter, or another ultrasonic flow detection device, it is important that the couplant materials 20, **26*a* and 28*a*** utilized provide a sound path of good acoustical coupling. It is also important that the couplant withstand thermal cycling over the ordinary range of operating temperatures for the equipment, and that the acoustical properties remain stable for long periods of time at operating temperatures. Moreover, a couplant material, to be practical, must provide no irritating fumes or in any event a minimum of such fumes, to prevent danger to operators and others in the operating environment. It is also important that the couplant material does not outgas which would disturb the sound path. At most, the pipe, or other substrate, should require only superficial wire brushing to make the sound path connection with the couplant material. All of these traits must be found in a material which is both easy to apply and use and which does not require expensive surface preparations such as by grinding or machining.

It has been found that fluoroether greases provide these characteristics. Two fluoroether greases are preferred; these are Nye Fluoroether Grease 849 and Dupont Krytox® grease.

Nye Fluoroether Grease 849 is available from Wm. F. Nye, Inc., New Bedford, Mass. This grease is a smooth polytetrafluoroethylene (PTFE) grease recommended as a lubricant for use below 300° C. (572° F.). It has been found that this material has the unexpected property of being an a good ultrasonic conductor which is sonically and chemically stable at temperatures from room temperature to over 500° F.

The Nye Fluoroether Grease 849 is known as a stable lubricant. It is known to be resistant to oxidation and thermal breakdown at temperatures over 500° F. Thermal breakdown, according to promotional literature, does not occur below 572° F. It is non-flammable. It is recommended for use in chemically resistant lubrication for stopcocks, valves, and ground-glass connectors, and is said to permit longer exposure to non-fluorinated aggressive chemicals than do traditional chlorofluorocarbon or fluorosilicone-based greases.

The Nye Fluoroether Grease 849 is a member of a series of thermally and oxidatively stable synthetic fluids comprising completely fluorinated polyethers with distinctive properties of high specific gravity, low surface tension, inertness toward most plastics and elastomers, immiscibility with all solvents, except highly fluorinated solvents, and inertness toward normally destructive chemicals. When these completely fluorinated polyethers are gelled with extremely stable, chemically-inert fluorocarbon polymers, the resulting greases are said to afford great lubrication capabilities in extreme environments. Generally, the grease is gelled with a fluorocarbon such that it comprises about 35 wt. % PTFE.

Krytox® fluorinated grease is available from Dupont Company, Chemicals and Pigments Department Performance Products, Wilmington, Delaware. This material is a perfluoropolyalkylether (PFPE) grease recommended for use as a lubricant at temperatures ranging from −20° to 300° C. (−5° to 570° F.). It has been found that this material is also an excellent ultrasonic couplant over a large temperature range, far superior to the compound proposed for such use in U.S. Pat. No. 4,738,737, and other known couplants.

The Krytox® grease is known as a general purpose lubricant. It is oxidation resistant and nonflammable to over 300° C. It is recommended for use as a pump seal and bearing lubricant in chlorine environments, an aircraft fuel pump and instrument bearing grease, a valve and 0-ring lubricant in oxygen and chlorine environments, etc., and generally is suitable for use in equipment operating under severe conditions.

The Krytox ® grease is a member of a series of fluorinated oils and greases intended for use in applications where high-temperature resistance, nonflammability and nonreactivity with aggressive chemicals is required. This grease has the distinctive properties of high density and compressibility while not promoting rust or corrosion. Furthermore, this grease is compatible with rubber and plastic, and is water resistant.

Krytox ® grease comprises a Krytox ® oil thickened to grease-like consistency by a thickening agent which may be the solid tetrafluoroethylene telomer component of Vydax ® 1000 fluorotelomer dispersion, which is also available from Dupont Company. Krytox ® grease is based upon a series of fluorine-end-capped homopolymers of hexafluoropropylene epoxide with the following chemical structure:

$$F-\underset{CF_3}{CF}-CF_2-O-\ {}_{n}-CF_2CF_3$$

wherein n=7 to 37 (according to "Krytox Fluorinated Lubricants" a brochure of the Dupont Co., page 16).

Applicant has discovered and established that fluoroether greases in general and the particular fluoroether greases known as Nye Fluoroether Grease 849 and Dupont Krytox ® grease make excellent couplant materials for establishing a sound path of good acoustical impedance between a transducer housing and its internal crystal and its support substrate in applications where there is thermal cycling for sustained periods of time. Laboratory tests of months of temperature cycling were conducted without serious deterioration of the ability of the fluoroether couplant material to give a sound path of good acoustical coupling.

Of course, the invention can also be employed with other ultrasonic flowmeters also available from the present assignee. It has been tested and found superior to all other known couplants with flowmeter systems under wide temperature range conditions. This acoustic complant is believed to be superior for use with both permanently and temporarily mounted flowmeters; as well as ultrasonic equipment in general.

Although an illustrative embodiment of the invention has been described, the appended claims are not so limited and should be construed to include modifications and variations which may occur to one of ordinary skill in the pertinent art.

What is claimed is:

1. In combination; an ultrasonic transducer comprising a housing and a crystal, a conduit for carrying fluid, a clamping structure for clamping a surface of said housing to the exterior surface of said conduit, and a sonic coupling fluid disposed between said surface of said transducer housing and said exterior surface; said coupling fluid comprising a fluoroether grease and also disposed between said crystal and said housing.

2. The combination of claim 1, wherein said fluoroether grease is selected from the group consisting of polytetrafluoroethylene grease and perfluoropolyalkylether grease.

3. The combination of claim 1, wherein the fluoroether grease is a polytetrafluoroethylene grease.

4. The combination of claim 1, wherein said fluoroether grease is a perfluoropolyalkylether grease.

5. The combination of claim 4, wherein said perfluoropolyalkylether grease is a fluorine-end-capped homopolymer of hexafluoropropylene epoxide containing a thickening agent.

6. In combination; an ultrasonic transducer for clamping to a conduit for carrying fluid and for measuring the flow of said fluid; said ultrasonic transducer comprising a crystal and a housing; and a sonic coupling fluid disposed between said surface of said crystal and said housing; said coupling fluid comprising a fluoroether grease.

7. The combination of claim 6, wherein said fluoroether grease is selected from the group consisting of polytetrafluoroethylene grease and perfluoropolyalkylether grease.

8. The combination of claim 6, wherein the fluoroether grease is a polytetrafluoroethylene grease.

9. The combination of claim 6, wherein said fluoroether grease is a perfluoropolyalkylether grease.

10. The combination of claim 9, wherein said perfluoropolyalkylether grease is a fluorine-end-capped homopolymer of hexafluoropropylene epoxide containing a thickening agent.

11. In combination; an ultrasonic transducer co a housing adapted for coupling to a conduit which carries fluid; a flat thin ultrasonic crystal; and a layer of viscous sonic coupling fluid disposed and extending between a flat surface portion of said transducer housing and a surface of said crystal; said coupling fluid comprising a homogeneous fluoroether grease.

* * * * *